(12) United States Patent
Jahnke et al.

(10) Patent No.: US 7,508,728 B2
(45) Date of Patent: Mar. 24, 2009

(54) METHODS AND APPARATUS TO PROVIDE REFRESH FOR GLOBAL OUT OF RANGE READ REQUESTS

(75) Inventors: Steve Richard Jahnke, Tokyo (JP); Hiromichi Hamakawa, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 295 days.

(21) Appl. No.: 11/512,675

(22) Filed: Aug. 30, 2006

(65) Prior Publication Data

US 2008/0056043 A1 Mar. 6, 2008

(51) Int. Cl.
*G11C 7/00* (2006.01)
(52) U.S. Cl. .................... 365/222; 365/230.06
(58) Field of Classification Search ............ 365/222 O, 365/230.01, 230.03, 230.06 X
See application file for complete search history.

(56) References Cited

U.S. PATENT DOCUMENTS 5,914,905 A * 6/1999 Hikichi et al. ............... 365/229
6,414,900 B1 * 7/2002 Spriggs et al. ......... 365/230.06

* cited by examiner

*Primary Examiner*—VanThu Nguyen
(74) *Attorney, Agent, or Firm*—Alan K. Stewart; W. James Brady; Frederick J. Telecky, Jr.

(57) ABSTRACT

Methods and apparatus to provide refresh when an out of range address is received are disclosed. An example method of providing a refresh signal to a memory cell includes receiving a memory address on address lines ranging from a most significant bit address line to a least significant bit address line. A memory driver logic device is coupled to the memory cell. An out of range logic decoder is coupled to provide a fixed logic input to a first input of the memory driver logic device. Address logic is provided to cause the memory driver logic device to enable the memory cell if the memory address is a local out of range address.

22 Claims, 5 Drawing Sheets

METHODS AND APPARATUS TO PROVIDE REFRESH FOR GLOBAL OUT OF RANGE READ REQUESTS

FIELD OF THE DISCLOSURE

This disclosure relates generally to memory devices and, more particularly, to methods and apparatus to provide refresh for an out of range read request to a memory device.

BACKGROUND

Asynchronous embedded static random access memory (SRAM) is a common memory device that requires refreshing of its memory cells to retain stored data. Embedded SRAM memory cells are typically composed of devices that hold data without having to refresh individual cells. However, the cells must have a complete electrical path to avoid a state that may cause loss of data integrity. Rather than refreshing on a periodic basis, which decreases the time during which a memory may be accessed, refreshes of the memory cells are typically performed only during a read operation during which the memory cells are read and a complete electrical path is maintained to enable the memory to retain the data.

A typical memory array includes eight word rows and multiple base two columns. The row is first selected and then the column is selected to cause the data from a particular memory cell to be addressed and refreshed by maintaining a complete electrical path. However, a circuit design using memory may not require an entire full base two range of columns or blocks or all the possible memory addresses in a row. Power conservation and gate efficiency is an important factor in circuit design and, thus, it is desirable to eliminate unnecessary memory capacity. For example, in the case of ASIC standard 2 port memory, users may configure the word length, bit length and x-y ratio by entering a desired memory length resulting in odd numbers of word lengths. When the addresses of words are not used, they are referenced as a global out of range in the case of an unused column address or a local out of range in the case of unused row addresses. For example, if a memory only requires 72 words, there would be nine full columns each having a four bit address, but seven potential block addresses would be not used and, thus, are possible global out of range addresses.

To read data from each cell, an address is sent to various row bit lines and column select lines that allow a particular word to be read. However, the cells must be refreshed during any read request because there is no scheduled refresh of the memory cells. In the case of a read directed to either a local or global out of bounds address (e.g., an attempt to access blocks 9-15 in the above example), the read would result in not refreshing the memory because the appropriate column would not exist, thereby breaking the complete electrical path and resulting in a bit line floating in a tristate condition and destroying stored data.

Thus, to insure that the memory array is refreshed whenever an out of range address is received the words in an existing row or column must be addressed to refresh the memory. The logic to determine the out of range address and refresh the appropriate existing memory blocks requires additional gates (e.g., out of range detection logic) and increases power consumption. In certain cases, access time to the memory is also increased because of the complexity of the out of range detection logic. Further, drive conflicts may occur because of propagation delay causing interference with subsequent read requests.

DETAILED DESCRIPTION

Figure 1:
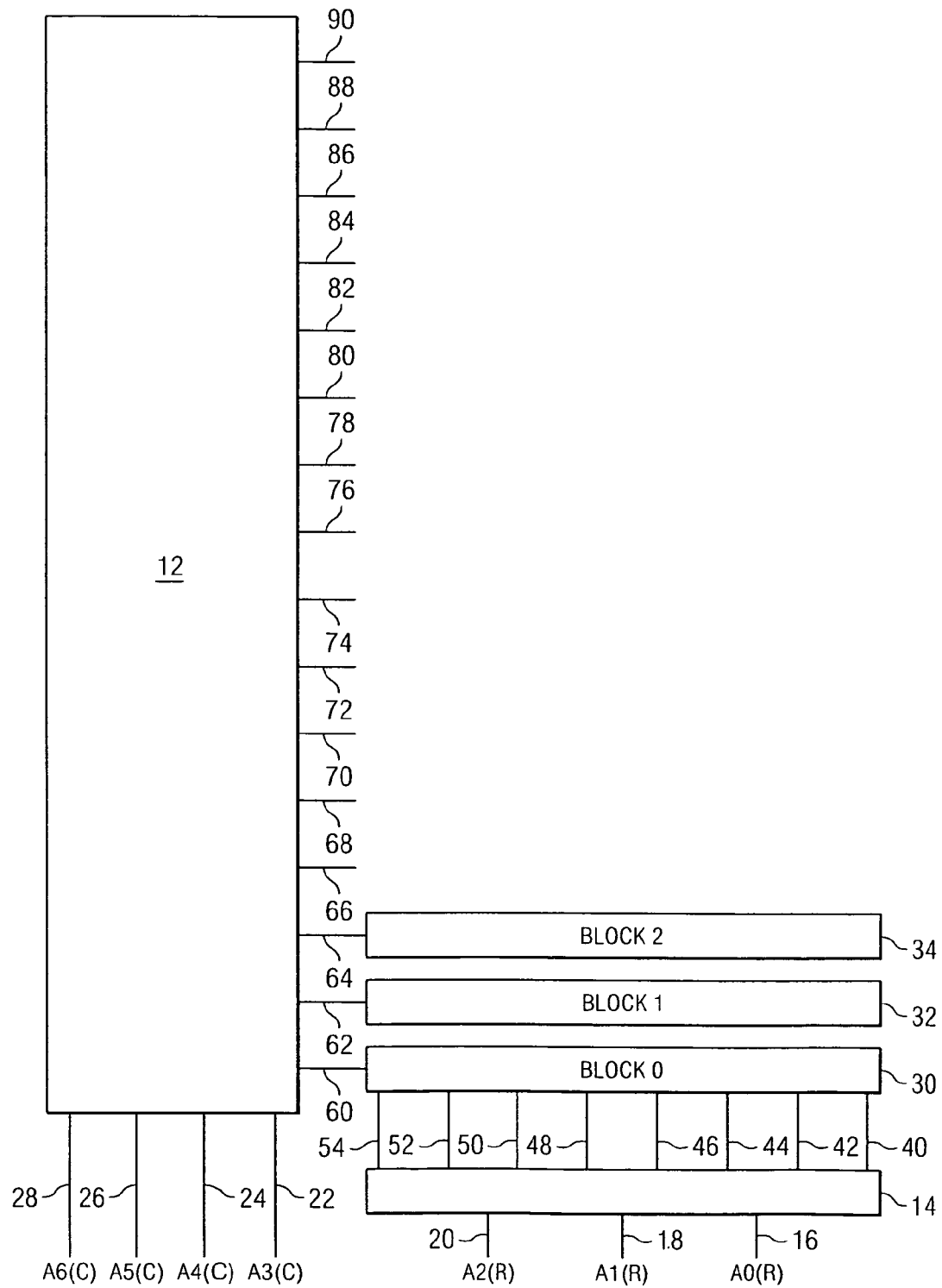
FIG. 1 is a circuit diagram of a portion of an example SRAM array.

FIG. 1 is a circuit diagram of an example embedded SRAM memory array 10 having blocks of memory cells with a column address decoder 12 that performs refresh on the memory blocks when a global out of range address is received. The memory array 10 in this example has 8 rows of memory cells that are addressed by a row decoder 14 having row address lines 16, 18 and 20 (A0-A2) in each of up to 16 columns or memory blocks. The memory blocks are addressed by the column address decoder 12, which has column address lines 22, 24, 26 and 28 (A3-A6). In this example, the memory array 10 has a group of memory blocks 30, 32 and 34 (blocks 0-2), each of which has 8 rows of memory cells (rows 0-7). The row decoder 14 has a series of bit lines 40, 42, 44, 46, 48, 50, 52 and 56, which are used to address a particular row in a selected memory block. The column address decoder 12 has three column select lines 60, 62 and 64, which are coupled to the memory blocks 30, 32 and 34, respectively. The column address decoder 12 may be expanded up to, for example, 16 memory blocks by activating additional column select lines 66, 68, 70, 72, 74, 76, 78, 80, 82, 84, 86, 88 and 90.

Figure 2:
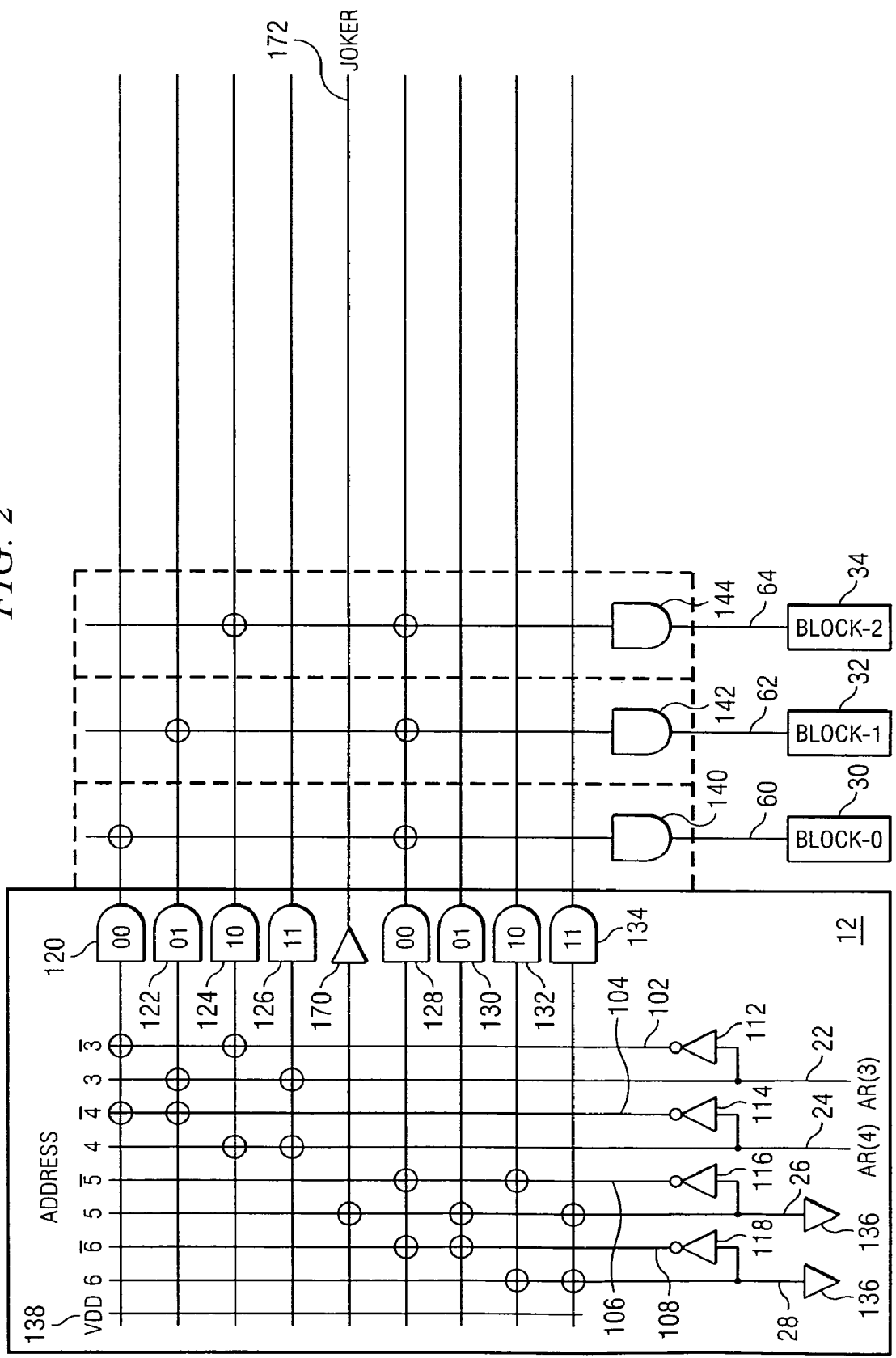
FIG. 2 is a circuit diagram of an example column address decoder that functions as an example global out of range circuit in the example SRAM array of FIG. 1.

FIG. 2 is a circuit diagram of the example column address decoder 12 of the memory array 10. The example decoder 12 is configured to only access memory blocks 30, 32 or 34 (blocks 0-2) and, thus, address requests to blocks 3-15 are globally out of range. A particular memory block is selected using the column address lines 22, 24, 26 and 28, which represent a 4-bit address for the columns or memory blocks. Each column address line 22, 24, 26 and 28 has a corresponding inverted column address line 102, 104, 106 and 108. The column address decoder 12 in this example is a programmable logic array (PLA), which may be implemented for use with a particular memory configuration depending on the number of memory blocks used and the corresponding number of global out of range memory addresses.

Those of ordinary skill in the art will recognize that the column address decoder 12 may be implemented using a processor, a controller and/or any other suitable processing device. For example, machine accessible instructions may be embodied in coded instructions stored on a tangible medium such as a flash memory, or random access memory (RAM) associated with a processor. Alternatively, some or all of the example column address decoder 12 of FIG. 2 may be implemented using an application specific integrated circuit (ASIC), a programmable logic device (PLD), a field programmable logic device (FPLD), discrete logic, hardware, firmware, etc. Also, some or all of the example functions may be implemented manually or as combinations of any of the foregoing techniques, for example, a combination of firmware, software and/or hardware.

The column address lines 22, 24, 26 and 28 are coupled to respective inverters 112, 114, 116 and 118, which have outputs coupled to the respective inverted column address lines 102, 104, 106 and 108. A series of 2 input AND gates 120, 122, 124 and 126, each corresponding to one of the four least significant bit addresses (00, 01, 10 and 11), have outputs coupled to various block driver AND gates 140, 142 and 144. The block driver AND gates 140, 142 and 144 are coupled to the column select lines 60, 62 and 64, respectively. The column select lines 60, 62 and 64 are global out of range outputs for the memory blocks 30, 32 and 34 (blocks 0-2), respectively, of the memory array 10 (FIG. 1). The output of a high signal (i.e., a logical high) from one of the block driver AND gates 140, 142 and 144 enables a read operation of a respective memory block via the column select lines 60, 62 or 64.

A series of 2 input AND gates 128, 130, 132 and 134, each representing one of the four least significant bit values (00, 01, 10 and 11) of the four bit column address have inputs that are coupled to the two least significant bit column address lines 26 and 28 and the inverted column address lines 106 and 108. In this example, the potential memory block addresses 4-15 are not used and, thus, the column address decoder 12 has been configured to deactivate the logic for these addresses by coupling a logic low such as a ground input 136 to the column address lines 26 and 28 (the most significant bits of the column address). The inverted column address lines 106 and 108 are coupled to an input of the AND gate 128. The other input of the AND gate 128 is coupled to a high logic input such as a voltage source 138. The output of the AND gate 128 is coupled to one of the inputs of each of the block driver AND gates 140, 142 and 144. Thus, one input of each of the block driver AND gates 140, 142 and 144 is always at a high logic level (e.g., a logical 1) in this example.

The second input of the block driver AND gate 140 is coupled to the output of the AND gate 120. Thus, when the column address 00 is input to the two least significant bit column address lines 22 and 24, the AND gate 120 outputs a high signal causing the block driver AND gate 140 to output a high signal on the column select line 60 to enable a read of the memory block 30 (block 0). Similarly, when column addresses of 01 or 10 are input on the two least significant bits in the column address, the block driver AND gate 142 or 144 outputs a high signal on the respective column select line 62 or 64 to enable a read of the memory block 32 (block 1) or the memory block 34 (block 2).

The first input of the AND gate 122 is coupled to the column address line 22 and the second input of the AND gate 122 is coupled to the voltage source 138. Thus, when a global out of range column address of 11 (block 3) is input to the two least significant bit column address lines 22 and 24, the AND gate 122 outputs a logical high signal, which causes the block driver AND gate 142 to output a logical high signal on the column select line 62 to refresh the memory block 32 (block 1). The voltage source 138 is also coupled to an amplifier 170 that has an output coupled to an out of range control line 172, which is not used in this configuration.

Figure 3:
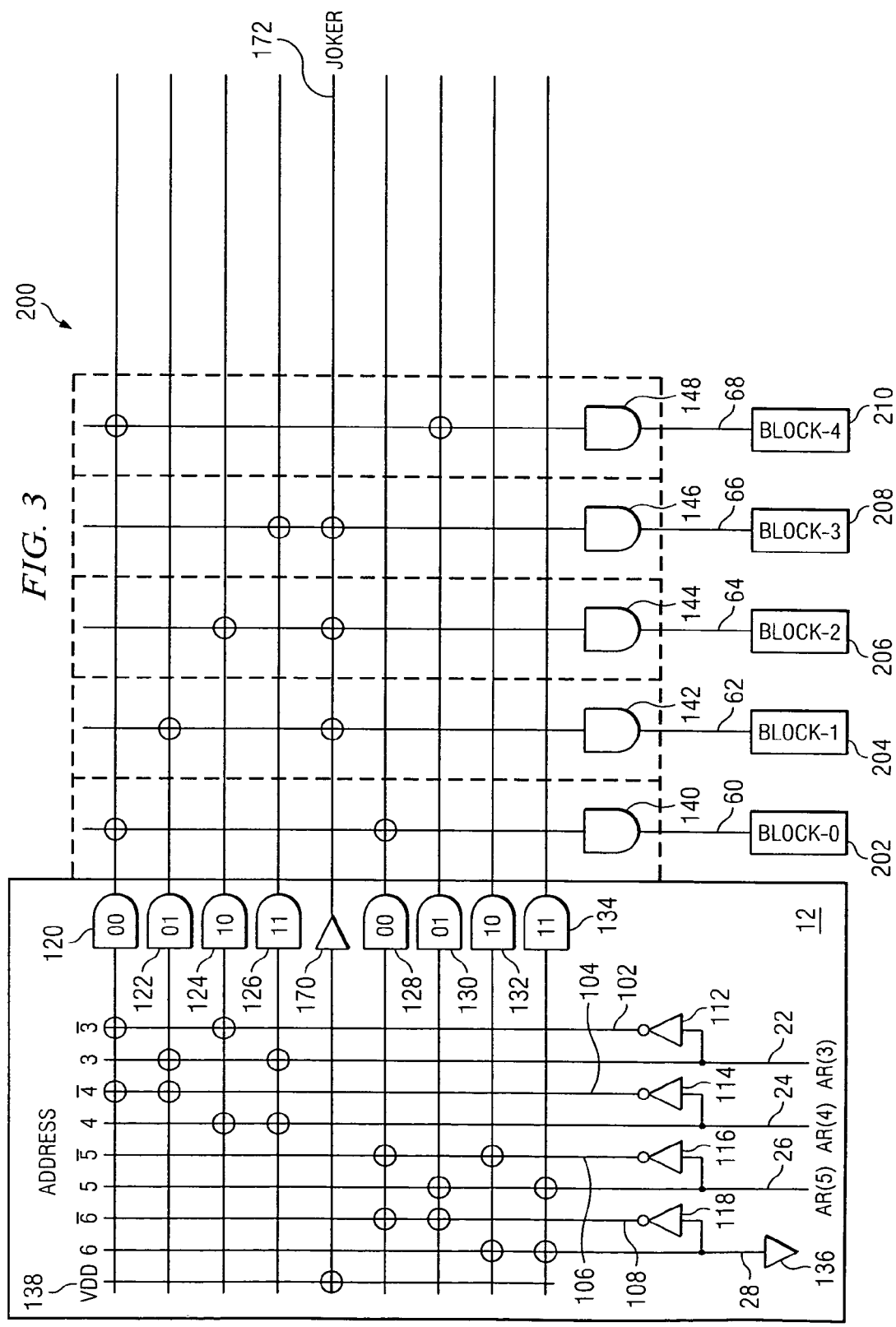
FIG. 3 is a circuit diagram of another example memory array using a configuration of the example column address decoder of FIG. 2 as a global out of range circuit.

FIG. 3 is another example configuration of the column address decoder 12 in FIG. 2 in conjunction with a memory array 200. As will be explained below, the various interconnections between components in the column address decoder 12 have been configured to allow the column address decoder 12 to function as a global out of range circuit in the case of out of range addresses for three memory blocks. The memory array 200 has five memory blocks 202, 204, 206, 208 and 210 (blocks 0-4). Each of the memory blocks 202, 204, 206, 208 and 210 is enabled by the output of a respective one of the block driver AND gates 140, 142, 144, 146 and 148, which in turn drive respective column select lines 60, 62, 64, 66 and 68 for reading the data stored in a respective one of the memory blocks 202, 204, 206, 208, and 210. The column address lines 22, 24 and 26 (AR3-AR5) are used to select a specific one of the memory blocks 202, 204, 206, 208 or 210 (blocks 0-4). Thus, the column addresses 110-111 (blocks 5-7) are global out of range addresses. The column address line 28 is coupled to low logic input 136 because the most significant bit column address line 28 (AR6) is unused in the memory array circuit 200.

The first inputs of the block driver AND gates 140, 142, 144, 146 and 148 are coupled to the outputs of the AND gates 120, 122, 124, 126 and 120, respectively. The second inputs of the block driver AND gates 142, 144 and 146 are coupled to the out of range control line 172 for a constant logical high input to the AND gates 142, 144 and 146. The second input of the block driver AND gates 140 and 148 are coupled to the outputs of the AND gates 128 and 130, respectively.

In the example configuration in FIG. 3, the memory blocks 202, 204, 206, 208 and 210 (blocks 0-4) may be selected for a read operation by inputting the column address to the column address lines 22, 24 and 26. For example, to address block 4, a column address of 100 is input to the column address lines 26, 24 and 22, respectively. The column address lines 22 and 24 are driven low (i.e., to a logical low) while the column address line 26 is driven high (i.e., to a logical high). The column address lines 22 and 24 cause the inverted column address lines 102 and 104 to drive a high output from the AND gate 120, which is coupled to the first input of the block driver AND gate 148. The column address line 26 is coupled to one input of the AND gate 130. The other input of the AND gate 130 is coupled to the inverted address line 108. The output of the AND gate 130 is driven high and is coupled to the second input of the block driver AND gate 148, causing a high output from the block driver AND gate 148 to enable the read and refresh of the memory block 210 (block 4).

In the case of an out of range global address, the column address decoder 12 in this configuration enables the refresh of actual (i.e., physical) memory blocks. For example, if a global out of range address for column 6 is received (binary address 110) to the column address lines 26, 24 and 22, high signals are input to the AND gate 124, which outputs a high signal to the first input of the block driver AND gate 144 corresponding to the memory block 206 (block 2). The second input of the block driver AND gate 144 is coupled to the out of range control line 172. This causes a high output from the block driver AND gate 144 to the column select line 64 and refreshes the memory block 206 (block 2).

Those of ordinary skill in the art will understand that additional sixth and seventh memory blocks may be added to the memory array 200. The column address decoder 12 in FIG. 3 may be configured to accommodate the additional memory blocks by activating the appropriate number of block driver AND gates and column select lines. For example, in the case of adding a sixth block, the second input of the block driver AND gate 142 is coupled to the output of the AND gate 128 instead of the out of range control line 172 to insure proper global out of range address detection for two global out of range addresses. In the case of adding a seventh block, the second inputs of both the block driver AND gates 142 and 144 are coupled to the output of the AND gate 128 instead of the out of range control line 172 to insure proper global out of range address detection for one global out of range address.

Figure 4:
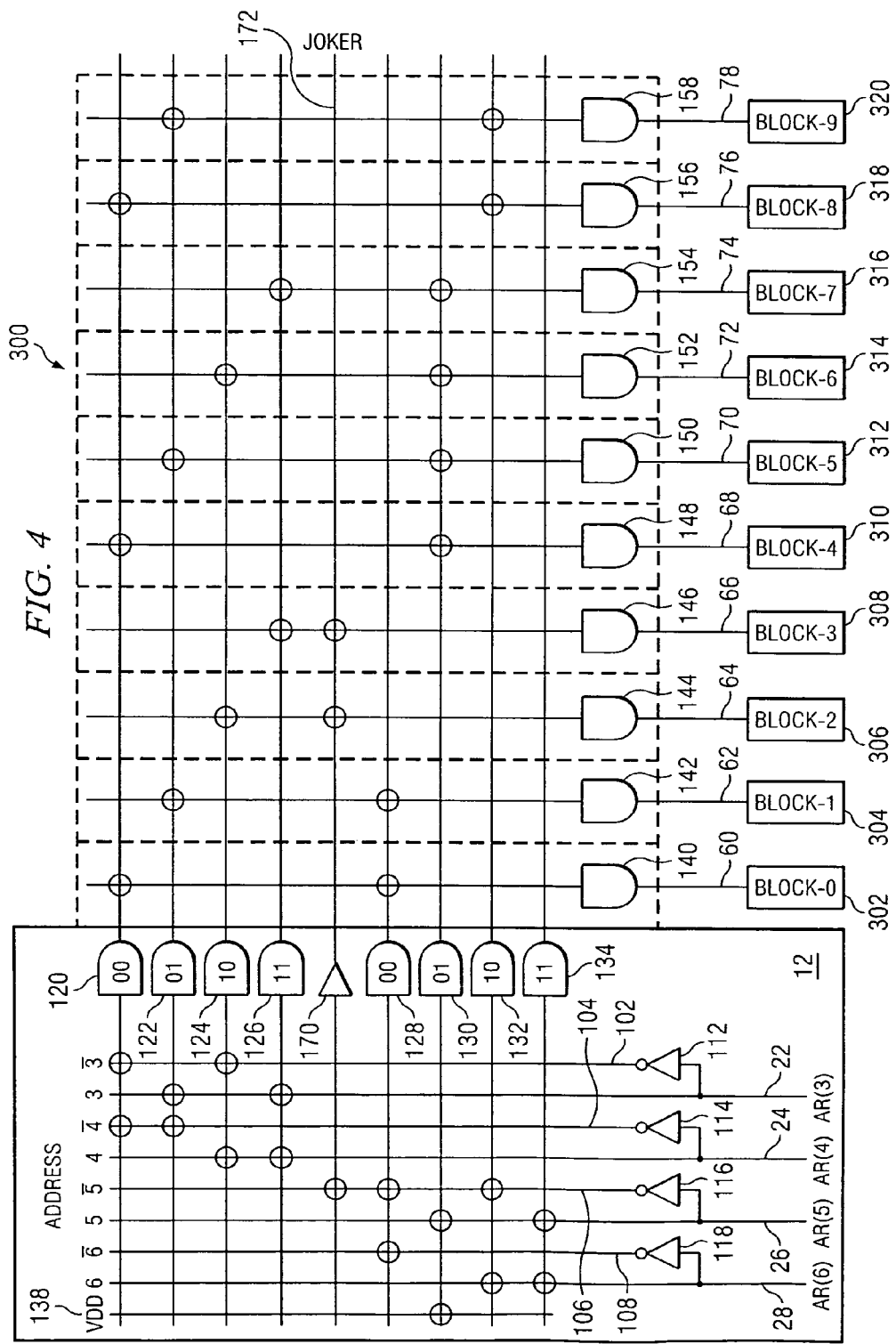
FIG. 4 is a circuit diagram of another example memory array using a configuration of the example column address decoder of FIG. 2 as a global out of range circuit.

FIG. 4 is another example configuration of the column address decoder 12 in FIG. 2 used with a memory array 300. As will be explained below, the various interconnections between components in the column address decoder 12 have been configured to allow the column address decoder 12 to function as a global out of range circuit in the case of out of range addresses for 6 memory blocks. The memory array circuit 300 has ten blocks of memory 302, 304, 306, 308, 310, 312, 314, 316, 318 and 320 (blocks 0-9). Each of the memory blocks 302, 304, 306, 308, 310, 312, 314, 316, 318 and 320 is enabled by the high output of a corresponding block driver AND gate 140, 142, 144, 146, 148, 150, 152, 154 and 156, which drive respective bit lines 60, 62, 64, 66, 68, 70, 72, 74, 76 and 78 for reading the data stored in the respective memory blocks 302, 304, 306, 308, 310, 312, 314, 316, 318 and 320. The column address lines 22, 24, 26 and 28 (AR3-AR6) are used to select a specific one of the memory blocks 0-10. Thus, binary column addresses 1101 through 1111 (blocks 11-15) are global out of range addresses.

In this configuration, the inverted column address line 106 is coupled to the input of the amplifier 170 to output the inverted value of the column address line 26 on the out of range control line 172. The inputs of the AND gates 120, 122, 124 and 126 are coupled to the two least significant bit column address lines 22 and 24 or the inverted column address lines 102 and 104. The inputs of the AND gates 128, 130 and 132 are coupled to the two most significant bit column address lines 26 and 28 or the inverted column address lines 106 and 108. The inputs of the AND gate 130 are coupled to the inverted column address line 108 and the voltage source 138.

The first inputs of the block driver AND gates 140, 142, 144, 146, 148, 150, 152, 154, 156 and 158 are coupled to the outputs of AND gates 120, 122, 124, 126, 120, 124, 126, 120 and 122, respectively. The second inputs of the block driver AND gate 144 (block 2) and the block driver AND gate 146 (block 3) are coupled to the out of range control line 172. The second inputs of the block driver AND gates 140 and 142 (blocks 0-1) are coupled to the output of the AND gate 128. The second inputs of the block driver AND gates 148, 150, 152 and 154 (blocks 4-7) are coupled to the output of the AND gate 130. The second input of the block driver AND gates 156 and 158 (blocks 8-9) are coupled to the output of the AND gate 132.

In the example configuration in FIG. 4, the memory blocks 302, 304, 306, 308, 310, 312, 314, 316, 318 and 320 (blocks 0-9) may be selected for a read operation by inputting the column address to the column address lines 22, 24, 26 and 28. For example, to address block 9, a column address of binary 1001 is input to the column address lines 28, 26, 24 and 22, respectively. The column address lines 22 and 28 are driven to a logical high while the column address lines 24 and 26 are driven to a logical low. The column address line 22 and the inverted column address line 104 drive a high output from the AND gate 122, which is coupled to the first input of the block driver AND gate 158. The inverted column address line 106 is coupled to one input of the AND gate 132. The other input of the AND gate 132 is coupled to the column address line 28. The output of the AND gate 132 is driven high and is coupled to the second input of the block driver AND gate 158 causing a high output from the block driver AND gate 158 to enable the read and refresh of memory block 320 (block 9).

In the case of an out of range global address, the column address decoder 12 in the configuration of FIG. 4 enables the refresh of actual (i.e., physical) memory blocks. For example, if a global out of range address for column 13 is received (binary address 1101), high signals will be sent to the inputs of the AND gate 122 from the column address line 22 and the column address invert line 104. The AND gate 122 outputs a high signal to the first input of the block driver AND gate 150 corresponding to memory block 312 (block 5). The second input of the block driver AND gate 150 is coupled to the output of the AND gate 130. The inputs of the AND gate 130 are coupled to the voltage source 138 and the column address line 26. This causes a high output from the block driver AND gate 150 to the column select line 70 and refreshes the memory block 312 (block 5).

The configuration of the column address decoder 12 in FIG. 4 may be altered for fewer or more memory blocks. For example, in the case of a memory array with nine blocks, the second input of the block driver AND gate 142 is coupled to the out of range control line 172 instead of the output of the AND gate 128. In the case of an additional eleventh memory block, the second input of the block driver AND gate 144 is coupled to the output of the AND gate 128 instead of the out of range control line 172 to insure proper refresh when out of range global addresses are received. In the case of a twelfth additional memory block, the second input of the block driver AND gates 144 and 146 are coupled to the output of the AND gate 128 instead of the out of range control line 172 to insure proper refresh when out of range global addresses are received.

Figure 5:
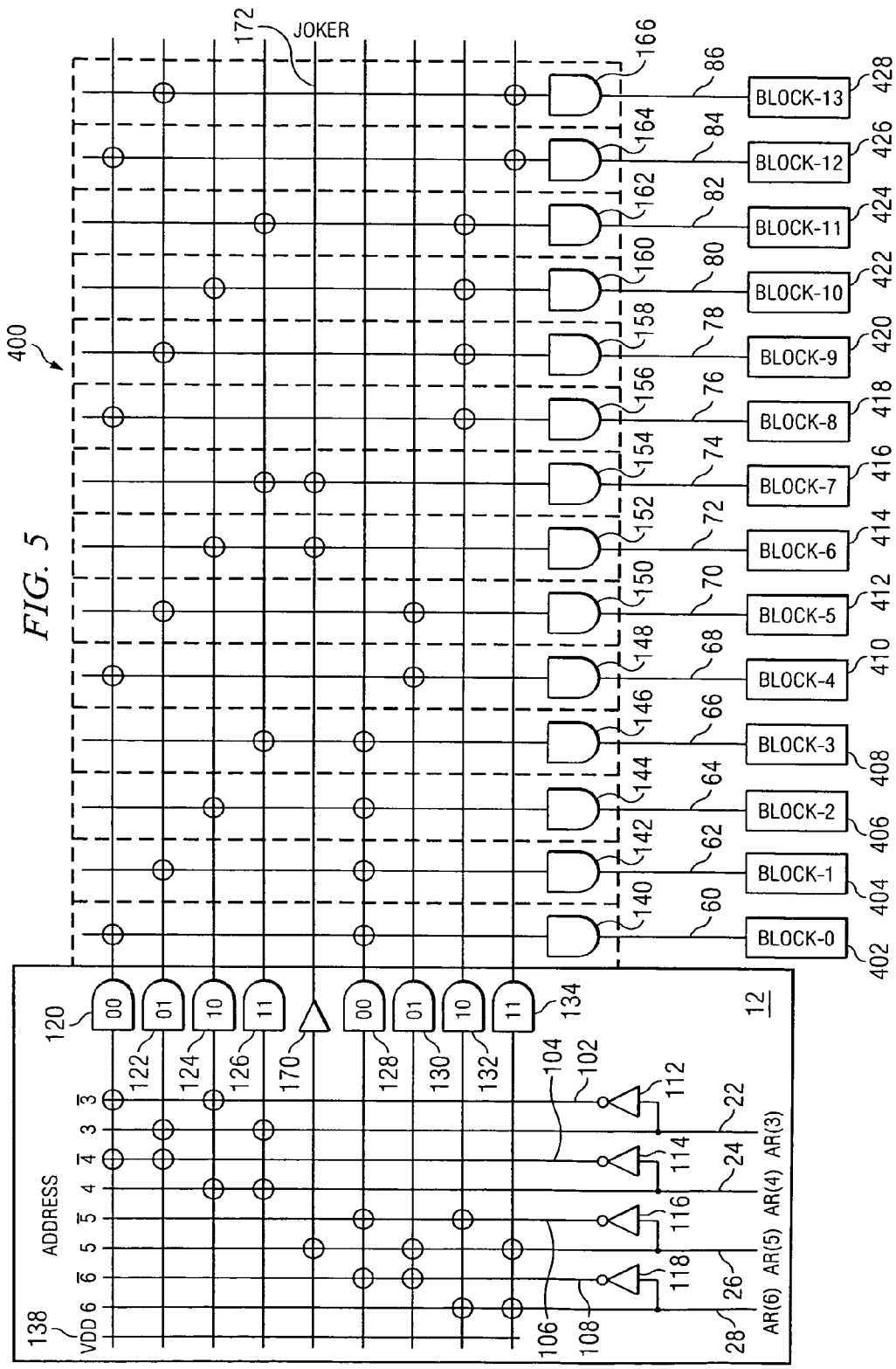
FIG. 5 is a circuit diagram of another example memory array using a configuration of the example column address decoder of FIG. 2 as a global out of range circuit.

FIG. 5 is another example configuration of the column address decoder 12 in FIG. 2 used in conjunction with a memory array 400. As will be explained below, the various interconnections between components in the column address decoder 12 have been configured to enable the column address decoder 12 to function as a global out of range circuit in the case of out of range addresses for two memory blocks. The memory array 400 has fourteen blocks of memory 402, 404, 406, 408, 410, 412, 414, 416, 418, 420, 422, 424, 426 and 428 (blocks 0-13). Each memory block is enabled by the output of a respective one of block driver AND gates 140, 142, 144, 146, 148, 150, 152, 154, 156, 158, 160, 162, 164 and 166, which drive respective bit lines 60, 62, 64, 66, 68, 70, 72, 74, 76, 78, 80, 82, 84 and 86 for reading the data stored in each memory block. The column address lines 22, 24, 26 and 28 (AR3-AR6) are used to select a specific one of the memory blocks 0-13. Thus, column addresses binary 1110 through 1111 (blocks 14-15) are global out of range addresses.

In the example configuration of FIG. 5, the column address line 26 is coupled to the input of the amplifier 170 to output the value of the column address line 26 on the out of range control line 172. The inputs of the AND gates 120, 122, 124 and 126 are coupled to the column address lines 22 and 24 or the inverted column address lines 102 and 104. The inputs of the AND gates 128, 130 and 132 are coupled to the column address lines 26 and 28 or the inverted column address lines 106 and 108.

The first inputs of the block driver AND gates 140, 142, 144, 146, 148, 150, 152, 154, 156, 158, 160, 162 and 164 are coupled to the outputs of the AND gates 120, 122, 124, 126, 120, 124, 126, 120, 122, 124, 126, 120 and 122, respectively. The second inputs of the block driver AND gate 152 (block 6) and the block driver AND gate 154 (block 7) are coupled to the out of range control line 172. The second inputs of the block driver AND gates 140, 142, 144 and 146 (blocks 0-3) are coupled to the output of the AND gate 128. The second inputs of the block driver AND gates 148 and 150 (blocks 4-5) are coupled to the output of the AND gate 130. The second inputs of the block driver AND gates 156, 158, 160 and 162 (blocks 8-11) are coupled to the output of the AND gate 132. The second inputs of the block driver AND gates 164 and 166 (blocks 12-13) are coupled to the output of the AND gate 134.

In the example configuration in FIG. 5, the memory blocks 402, 404, 406, 408, 410, 412, 414, 416, 418, 420, 422, 424, 426 and 428 (blocks 0-13) may be selected for a read operation by inputting the column address to the column address lines 22, 24, 26 and 28. For example, to address block 12, a column address of binary 1100 is input to the column address lines 28, 26, 24 and 22 respectively. The column address lines 22 and 24 are driven to a logical low while the column address lines 26 and 28 are driven to a logical high. The inverted column address lines 102 and 104 drive a logical high output from the AND gate 120, which is coupled to the first input of the block driver AND gate 164. The column address lines 26 and 28 are coupled to the inputs of the AND gate 134. The output of the AND gate 134 is driven high and is coupled to the second input of the block driver AND gate 164 causing a high output from the block driver AND gate 164 to enable the read and refresh of the memory block 426 (block 12).

In the case of an out of range global address, the column address decoder 12 in this configuration enables the refresh of actual memory blocks. For example, if a global out of range address for column 14 is received (binary address 1110), high signals will be sent to the inputs of the AND gate 124 from the column address invert line 102 and the column address line 24. The AND gate 124 outputs a high signal to the first input of the block driver AND gate 152 corresponding to the memory block 414 (block 6). The second input of the block driver AND gate 152 is coupled to the output of the amplifier 170. The input of the amplifier 170 is coupled to the column address line 26, which causes a high output from the block driver AND gate 152 to the column select line 72 and refreshes the memory block 414 (block 6).

Those of ordinary skill in the art will understand that the example configuration of the column address decoder 12 in FIG. 5 may be modified to accommodate fewer or more blocks of memory. For example, in the case of thirteen blocks of memory, the second input of the block driver AND gate 150 (block 5) is coupled to the out of range control line 172 instead of the output of the AND gate 130. In the case of fifteen blocks of memory, the second input of the block driver AND gate 150 is coupled to the output of the AND gate 130 instead of the out of range control line 172.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A column address decoder to address one of a plurality of memory blocks in a memory array, each of the memory blocks having up to a four bit address, the column address decoder comprising:
   a column address input including two least significant bit column address lines, a third least significant bit column address line, and a most significant bit column address line;
   a plurality of block driver logic devices, each coupled to one of the plurality of memory blocks, the block driver logic devices to produce a select signal to refresh the memory block;
   a first logic decoder coupled to the two least significant column address lines, the first logic decoder producing four outputs each corresponding to one of the four values of the two least significant column address lines;
   a second logic decoder coupled to the third least significant and the most significant bit column address lines, the second logic decoder producing four outputs each corresponding to one of the four values of the third least significant and the most significant bit column address lines; and
   wherein the outputs of the first and second logic decoders are connectable to the plurality of block driver logic devices to produce the select signal from one of the plurality of block driver logic devices based on an up to four bit address received on the column address input.

2. The column address decoder of claim 1, wherein the memory blocks have a two bit address and the block driver logic devices are AND gates having a first input coupled to the first logic decoder and a second input coupled to the second logic decoder to produce the select signal from one of the block driver logic devices when an out of range address is received having the same least significant bit as the two bit address of the memory block corresponding to one of the block driver logic devices.

3. The column address decoder of claim 1, further comprising an out of range control line connectable to the plurality of block driver logic devices to produce a select signal on one of the plurality of block driver logic devices when an out of range address is received on the column address input.

4. The column address decoder of claim 3, wherein the memory blocks have three bit addresses, the memory array having one to three possible out of range addresses and the out of range control line is connected to the block driver logic devices corresponding to memory blocks with an address having the same two least significant bits as the possible out of range addresses, wherein the out of range control line is coupled to a high logic input, and the out of range control line in conjunction with one of the first decoder logic outputs is to activate one of block driver logic devices to produce a select signal on the memory block with an address having the same two least significant bits of a received out of range address.

5. The column address decoder of claim 3, wherein the memory blocks have four bit addresses, the memory array has four to seven possible out of range addresses, and wherein the out of range control line is connected to the block driver logic devices coupled to the memory blocks having an address with a logical zero as a third least significant bit and the same two least significant bits as one of the possible out of range addresses, wherein the out of range control line is coupled to an inverted third least significant bit address column line, and wherein the output of the second decoder corresponding to a logical one as the third least significant bit is coupled to the block driver logic devices coupled to the memory blocks having an address having a logical one as the third least significant bit and the same two least significant bits as one of the possible out of range addresses, and wherein the out of range control line or the second decoder in conjunction with the first decoder logic output activates one of block driver logic devices to produce a select signal on the memory block with an address having the same three least significant bits of a received out of range address.

6. The column address decoder of claim 3, wherein the memory blocks have four bit addresses, the memory array has one to three possible out of range addresses and the out of range control line is connected to the block driver logic devices corresponding to memory blocks with addresses having the same three least significant bits as the possible out of range addresses, wherein the out of range control line is coupled to the third least significant bit address column line, the out of range control line in conjunction with one of the first decoder logic outputs is to activate one of block driver logic devices to produce a select signal on the memory block with an address having the same three least significant bits of a received out of range address.

7. The column address decoder of claim 1, wherein the block driver logic devices are AND gates.

8. The column address decoder of claim 1, wherein the first and second decoder include four AND gates, one of the four AND gates to produce a high signal when one of the four values of the two bit addresses is entered.

9. The column address decoder of claim 1, wherein, the memory blocks each include eight rows of memory cells.

10. A method of configuring a column address decoder to refresh one of a plurality of memory blocks, each having a four bit address, in a memory array, on receiving a global out of range address, the method comprising:
    determining the number of memory blocks;
    coupling a block driver logic device with a column select line to one of the memory blocks;
    providing a first decoder coupled to two least significant address bit inputs of a four bit address input to generate one of four outputs each corresponding to one of the four values of the two least significant address bit inputs;
    providing a second decoder coupled to a third least significant address bit input of the four bit address input and a most significant address bit input of the four bit address input to generate an output signal one of four outputs each corresponding to one of the four values of the third least significant address bit and most significant bit inputs;
    providing an out of range control line; and
    activating the logic block device to provide a refresh signal on the column select line via two of the first and second decoder and the out of range control line to the corresponding memory block when a global out of range address having the same least three significant bits of the memory block address is received on the address input.

11. The method of claim 10, wherein the column address decoder is a programmable logic array.

12. The method of claim 10 wherein the most significant bit and the third least significant bit of the address inputs are logical zeros, the memory array has three memory blocks, and wherein the memory block with the address having the same least significant bit as a global out of range address is activated by the first and second decoder.

13. The method of claim 10 further comprising:
    coupling the out of range control line to a high logical input; and
    wherein the most significant bit of the address input is a logical zero, the memory array has up to seven memory blocks, and wherein the block driver logic device is activated by one of the four outputs of the first decoder and the out of range control line.

14. The method of claim 10 further comprising:
    coupling the out of range control line to an inverted third least significant bit line; and
    wherein the memory array has between nine and fifteen memory blocks and wherein the block driver logic device is activated by one of the four outputs of the first decoder and the out of range control line when the received out of range address has a logical zero value in the third least significant address bit or the block driver logic device is activated by one of the four outputs of the first decoder and one of the four outputs of the second decoder when the received out of range address has a logical one value in the third least significant address bit.

15. The method of claim 10 further comprising:
    coupling the out of range control line to the third least significant bit address input; and
    wherein the memory array has between twelve and fifteen memory blocks and wherein the block driver logic device is activated by one of the four outputs of the first decoder and the out of range control line.

16. The method of claim 10, wherein the memory blocks each include eight rows of memory cells.

17. A column address decoder to provide a refresh signal to one of a plurality memory blocks each having a three bit address in a memory array, on receiving a global out of range three bit address from a possible three addresses, the column address decoder comprising:
    a most significant bit column address input line and two least significant bit column address lines to accept a three bit column address input;
    a plurality of block driver logic devices each having two inputs and an output, each coupled to one of the plurality of memory blocks, the block driver logic devices to produce a select signal to refresh the memory block;
    a first logic decoder coupled to the two least significant column address lines, the first logic decoder producing four outputs providing a first activation signal, each of the four outputs corresponding to each of the four values of the two least significant column address lines, one of the four outputs being coupled to the first input of each of the plurality of block driver logic devices; and
    a global out of range control line to provide an activation signal to the second input of each of the plurality of block driver logic devices coupled to memory blocks with an address having the same two least significant bits as each of the possible global out of range addresses.

18. The column address decoder of claim 17, wherein the block driver logic devices are AND gates and the first and second activation signals are logical high signals.

19. A column address decoder to provide a refresh signal to one of a plurality of up to fifteen memory blocks each having a four bit address in a memory array, on receiving a global out of range four bit address from a possible seven global out of range addresses, the column address decoder comprising:
    four column address input lines including two least significant bit column address lines, a third least significant bit column address line and a most significant bit column address line, the column address input lines to receive a four bit address input;
    a plurality of block driver logic devices each having two inputs and an output, each coupled to one of the plurality of memory blocks, the block driver logic devices to produce a select signal to refresh one of the plurality of memory blocks;
    a first logic decoder coupled to the two least significant column address lines, the first logic decoder producing four outputs providing a first activation signal, each of the four outputs corresponding to each of the four values of the two least significant column address lines, one of the four outputs being coupled to the first input of each of the plurality of block driver logic devices;
    a global out of range decoder to provide an activation signal to the second input of each of the plurality of block driver logic devices coupled to memory blocks with an address having the same three least significant bits as each of the possible global out of range addresses; and
    wherein the decode logic sends a second activation signal to the second input of the block driver logic devices coupled to the memory block with an address having the same three least significant bits as a received the global out of range address on the four bit address input to activate the block driver logic device to refresh the memory block.

20. The column address decoder of claim 19, wherein the global out of range decoder includes an out of range control line coupled to an inverted third least significant bit address input line to output an activation signal when the third least significant bit of the input address is a logical one, and wherein the second input of each of the plurality of block driver logic devices is coupled to memory blocks with and address having the same three least significant bits as each of the possible global out of range addresses are coupled to either the out of range control line or the logic decoder; and wherein the memory array has between four and seven out of range four bit addresses.

21. The column address decoder of claim 19, wherein the global out of range decoder includes an out of range control line, the out of range control line outputting the value of the third least significant bit address input line and coupled to the second input of each of the plurality of block driver logic devices coupled to memory blocks with an address having the same three least significant bits as each of the possible global out of range addresses; and wherein the memory array has between one and three out of range four bit addresses.

22. The column address decoder of claim 19, wherein the block driver logic devices are AND gates and the first and second activation signals are logical high signals.

* * * * *